(12) United States Patent
Saghi et al.

(10) Patent No.: US 8,775,888 B2
(45) Date of Patent: Jul. 8, 2014

(54) METHODS AND STRUCTURE FOR CORRELATING MULTIPLE TEST OUTPUTS OF AN INTEGRATED CIRCUIT ACQUIRED DURING SEPARATE INSTANCES OF AN EVENT

(75) Inventors: Eugene Saghi, Colorado Springs, CO (US); Jeffrey K. Whitt, Colorado Springs, CO (US); Joshua P. Sinykin, Shrewsbury, MA (US)

(73) Assignee: LSI Corporation, Milpitas, CA (US)

( * ) Notice: Subject to any disclaimer, the term of this patent is extended or adjusted under 35 U.S.C. 154(b) by 272 days.

(21) Appl. No.: 13/434,940

(22) Filed: Mar. 30, 2012

(65) Prior Publication Data

US 2013/0262945 A1 Oct. 3, 2013

(51) Int. Cl.
*G06F 11/00* (2006.01)

(52) U.S. Cl.
USPC .......................................... 714/744; 714/732

(58) Field of Classification Search
CPC .................. G01R 31/31921; H05K 999/99
USPC ......... 714/744, 724, 732, 733, 741, 736, 715, 714/39
See application file for complete search history.

(56) References Cited

U.S. PATENT DOCUMENTS

| | | | |
|---|---|---|---|
| 4,881,229 A * | 11/1989 | Kaltbeitzel et al. | 714/715 |
| 5,675,546 A * | 10/1997 | Leung | 365/201 |
| 5,951,696 A | 9/1999 | Naaseh et al. | |
| 6,374,370 B1 * | 4/2002 | Bockhaus et al. | 714/39 |
| 6,397,354 B1 | 5/2002 | Ertekin | |
| 6,499,123 B1 * | 12/2002 | McFarland et al. | 714/724 |
| 6,943,610 B2 | 9/2005 | Saint-Laurent | |
| 7,055,117 B2 | 5/2006 | Yee | |
| 7,263,646 B2 | 8/2007 | Glenn et al. | |
| 7,401,246 B2 | 7/2008 | Martin et al. | |
| 7,900,108 B2 | 3/2011 | Pugliesi-Conti et al. | |
| 2005/0044460 A1 | 2/2005 | Hoglund et al. | |
| 2010/0268906 A1 | 10/2010 | Gillingham et al. | |

* cited by examiner

*Primary Examiner* — Fritz Alphonse
(74) *Attorney, Agent, or Firm* — Duft Bornsen & Fettig

(57) ABSTRACT

Methods and structure for correlating multiple sets of test output signals in time are provided. The structure includes an integrated circuit comprising a block of circuitry that generates internal operational signals. The circuit also comprises a test multiplexer (MUX) hierarchy that selects subsets of the internal signals and applies the subsets to a testing element. A clock generator generates a clock signal for the selected signals. A test logic timer receives the clock signal and increments a counter value, and applies the counter value to the testing element. An event detector resets the counter value upon detection of an event, such that a first subset of the internal signals acquired from the test MUX hierarchy acquired responsive to detection of a first instance of the event may be correlated in time with a second subset of the internal signals acquired responsive to detection of a second instance of the event.

20 Claims, 5 Drawing Sheets

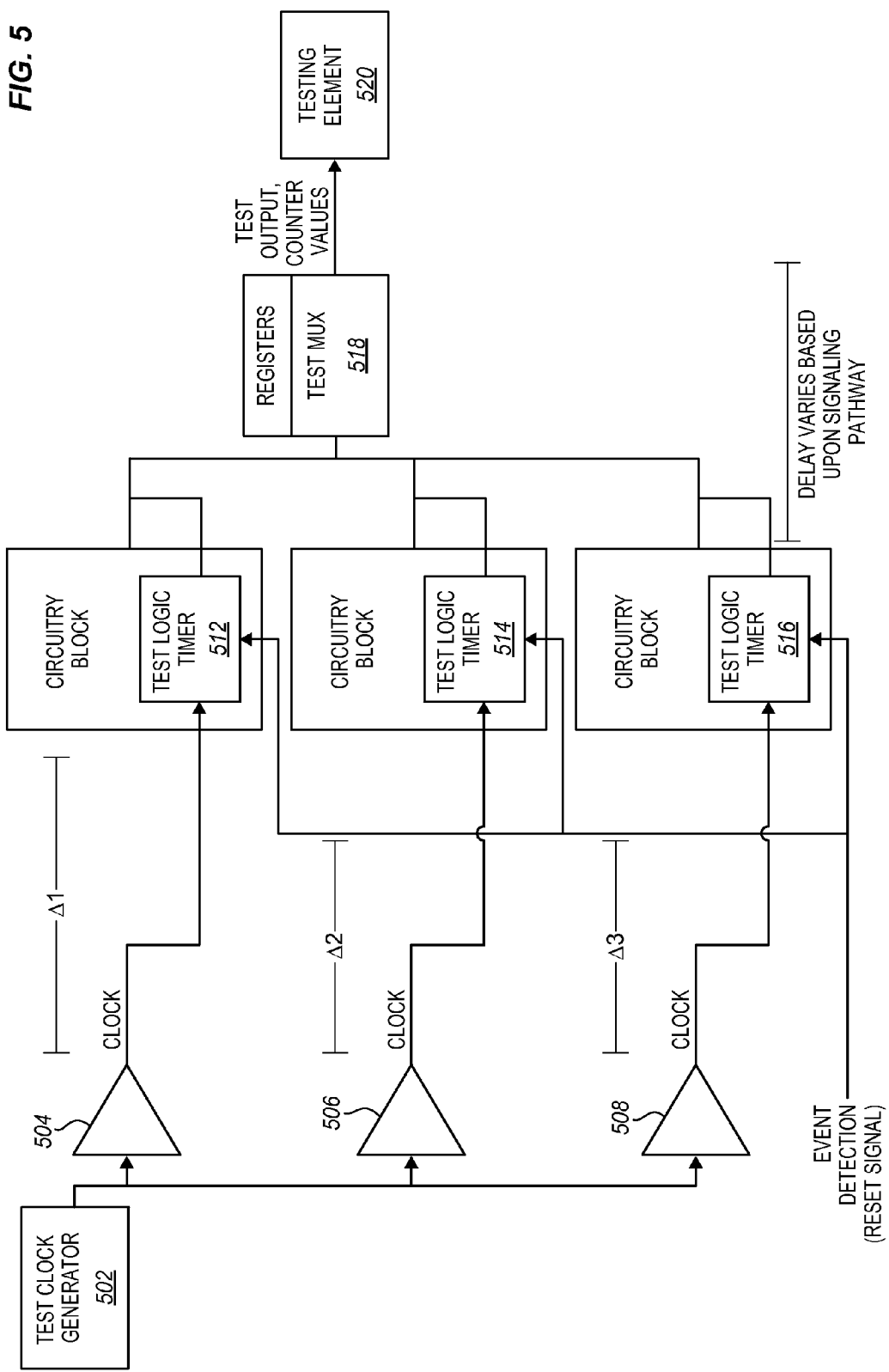

METHODS AND STRUCTURE FOR CORRELATING MULTIPLE TEST OUTPUTS OF AN INTEGRATED CIRCUIT ACQUIRED DURING SEPARATE INSTANCES OF AN EVENT

RELATED PATENTS

This patent is related to commonly owned U.S. patent application Ser. No. 13/434,962, filed on Mar. 30, 2012, and entitled "METHODS AND STRUCTURE FOR CORRELATION OF TEST SIGNALS ROUTED USING DIFFERENT SIGNALING PATHWAYS" which is hereby incorporated by reference.

BACKGROUND

1. Field of the Invention

The invention relates generally to integrated circuits including internal testing/debug components and more specifically relates to acquiring testing/debug signaling from such integrated circuits.

2. Discussion of Related Art

Electronic circuits perform a wide variety of designated functions for electronic systems. For example, integrated circuits may be used for data processing, data storage and retrieval, system analysis and control, and many other functions. Integrated circuits may be subject to programming, design, or operational errors, and internal operational signals are not exposed for acquisition by external devices during normal operation (i.e., they are internal to the circuit). It would be impractical or impossible to connect every internal operational signal to its own dedicated output pin of the circuit for monitoring purposes. As such, it is desirable not only to include logic at the circuit that performs the circuit's desired function, but also to include logic and components at the circuit for debugging and testing purposes (e.g., for externally monitoring internal operational signals of the circuit). For example, the circuit may include test multiplexers (MUXs) having registers that can be programmed to select internal operational signals for routing through the test MUXs. The test MUXs provide the selected internal operational signals as test outputs (e.g., specialized debug outputs) for the circuit. Utilizing MUXs to output test signals that are normally internal to the circuit ensures that the cost and size of a circuit implementing testing logic is reduced, because MUXs allow a large number of internal signaling pathways to be condensed into a much smaller number of output signal paths. These output paths may be monitored by a logic analyzer to acquire the selected internal operational signals.

Unfortunately, utilizing a hierarchy of test MUXs to provide internal debug signals results in a number of problems. For example, the very structure of a test MUX hierarchy typically limits the number of signals that can be used for analysis because the test MUX hierarchy sifts a large number of signals (e.g., millions of signals) into a much smaller number of signals (e.g., tens of signals). Furthermore, the selection of certain signals will preclude the selection of other signals because they use conflicting configurations of registers of the test MUX hierarchy. Thus, while a test MUX hierarchy typically allows the acquisition of a number of internal operational signals, it does not allow for the acquisition of a large fraction of the internal operational signals at once. Instead, only a small group of signals may be acquired simultaneously. Because electronic circuits continue to increase in complexity and size, the limited number of signals provided by the test MUX hierarchy for review may be insufficient to test the circuit's response to a given event.

In some systems, a crosspoint switch (also known as a "crossbar switch") may be used alternatively to or in conjunction with a test MUX hierarchy. The crosspoint switch may be used to address the issues of signal exclusion generally encountered by the test MUX hierarchy. However, even with a crosspoint switch only a small number of total signals may be selected for debugging purposes, which means that the crosspoint switch may still be insufficient to test the event-response characteristics of the circuit.

Thus it is an ongoing challenge to acquire a large number of internal operational signals for use in testing a circuit while at the same time keeping the cost of the circuit reasonable.

SUMMARY

The present invention addresses the above and other problems, thereby advancing the state of the useful arts, by providing methods and structure for coordinating test data from a circuit across multiple iterations of a triggering event. The test data acquired for each iteration of the event includes a uniform index indicating the passage of time (e.g., a common time base). Thus, signals acquired in the first set of test data can be correlated in time with different signals acquired in the second set of test data, even though the different signals were not acquired simultaneously.

In one aspect hereof, a method is provided. The method comprises generating, at a block of circuitry of an integrated circuit, internal operational signals for performing designated functions, and selecting, via a test multiplexer (MUX) hierarchy of the integrated circuit, a first subset of the internal operational signals for acquisition by a testing element. The method further comprises detecting a first instance of an event at the integrated circuit, resetting, responsive to detecting the event, a counter value of a test logic timer, and applying, responsive to detecting the event, the first subset of signals and the counter value of the test logic timer to the testing element. During acquisition, the counter value of the test logic timer is incremented based upon a clock signal for the test logic timer. The method additionally comprises selecting, via the test MUX hierarchy, a second subset of the internal operational signals for acquisition by the testing element. Further, the method includes detecting a second instance of the event at the integrated circuit, resetting, responsive to detecting the event, the counter value of the test logic timer, and applying, responsive to detecting the event, the second subset of signals and the counter value of the test logic timer to the testing element. During acquisition, the counter value of the test logic timer is incremented based upon the clock signal. Thus, the first subset of signals and the second subset of signals can be correlated in time based on the counter values acquired with each of the subsets.

Another aspect hereof provides an integrated circuit. The integrated circuit comprises a block of circuitry components operable to generate internal operational signals for performing designated functions. The integrated circuit also comprises a test multiplexer (MUX) hierarchy coupled to receive the internal operational signals, the test MUX hierarchy controllably operable to select subsets of the internal operational signals for acquisition and to apply the selected subsets to a testing element. Further, the integrated circuit comprises a clock generator operable to generate a clock signal for the signals selected via the test MUX hierarchy, and a test logic timer operable to receive the clock signal, to increment a counter value based upon the clock signal, and further operable to apply the counter value to the testing element. An event detector of the integrated circuit is operable to reset the counter value to a predefined value upon detection of an event, such that a first subset of the internal operational signals acquired from the test MUX hierarchy acquired responsive to detection of a first instance of the event may be correlated in time with a second subset of the internal operational signals acquired responsive to detection of a second instance of the event.

BRIEF DESCRIPTION OF THE DRAWINGS

FIG. 5 is a block diagram illustrating a further exemplary integrated circuit in accordance with features and aspects hereof.

DETAILED DESCRIPTION OF THE DRAWINGS

Figure 1:
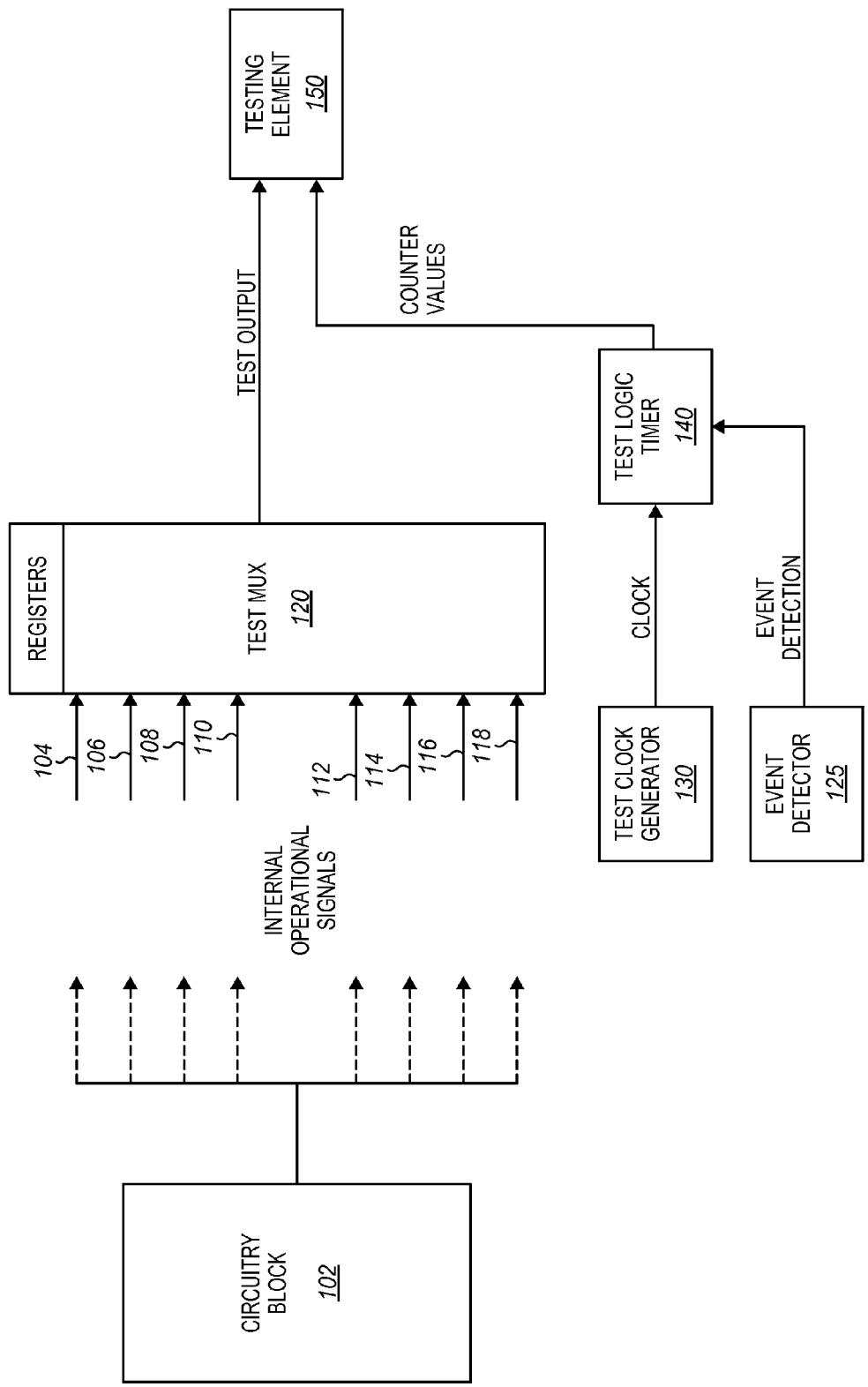
FIG. 1 is a block diagram of an exemplary integrated circuit in accordance with features and aspects hereof.

FIG. 1 is a block diagram of an exemplary integrated circuit in accordance with features and aspects hereof Utilizing the integrated circuit of FIG. 1, a designer of the integrated circuit may trigger an event multiple times in order to debug the circuit. Each time the event is triggered, the person testing the device may select a different set of signals for acquisition. Included along with the signals are counter values that allow the signals to be correlated in time, even though the signals were measured during different instances of the event (i.e., the common counter values allow for the generation of a common time base). Thus, signals acquired during the first instance can be analyzed along with signals acquired during the second instance to provide a greater amount of information describing how the circuit responds to instances of the event. In this embodiment, the integrated circuit comprises circuitry block 102, internal operational signals 104-118, test multiplexer (MUX) hierarchy 120, event detector 125, test clock generator 130, test logic timer 140, and testing element 150.

Circuitry block 102 comprises any system or component of a circuit operable to generate electronic signals for use in performing a function. Integrated circuits can be used in the performance of a vast number of different functions. For example, circuitry block 102 may comprise electronic components implementing a System On a Chip (SOC) or Redundant Array of Independent Disks On a Chip (ROC). In order to aid performance of these functions, circuitry block 102 may include operational timers, clocks, processors, signaling pathways, and other components. While only a single circuit block is depicted for the integrated circuit of FIG. 1, the number of circuit blocks utilized by the integrated circuit will vary as a matter of design choice.

The various components of circuitry block 102 are implemented in physical circuitry (e.g., the components may be implemented as an integrated circuit die). As such, it will be generally understood that internal operational signals of circuitry block 102 are generally unavailable for acquisition external to the integrated circuit unless they are routed through a dedicated test output.

During the performance of its functions, circuitry block 102 generates internal operational signals 104-118. The actual number of internal signals generated by circuitry block 102 may vary as a matter of design choice. Furthermore, signals 104-118 may comprise all of the internal signals generated by circuitry block 102, or may comprise some fraction thereof. Internal operational signals 104-118 may be continuously provided as inputs to test MUX hierarchy 120.

Test MUX hierarchy 120 comprises any system or component operable to select a subset of internal operational signals 104-118 for application to testing element 150. In this embodiment, test MUX hierarchy 120 receives signals 104-118 via one or more bus structures, each bus having a defined width in bits. Test MUX hierarchy 120 is operable to utilize internal switching logic (e.g., programmed in registers for one or more test MUXs) in order to provide the selected subset of internal operational signals to testing element 150. In this embodiment, test MUX hierarchy 120 is depicted as comprising a single test MUX, although a hierarchy/tree of multiple MUXs may be chosen in order to further facilitate signal selection processes. A person having ordinary skill in the art will appreciate that test MUX hierarchy 120 is typically incapable of presenting every single internal operational signal generated by the integrated circuit (e.g., millions of signals) to testing element 150 at the same time. Thus, it is desirable to iterate certain testing events multiple times so that multiple subsets of the internal operational signals may be acquired and then correlated in accordance with features and aspects hereof to determine the integrated circuit's activities during the event.

Event detector 125 comprises any system or component operable to detect an event at the integrated circuit of FIG. 1. An event may include any electrically detectable event at the integrated circuit. Event detector 125 may monitor one or more internal operational signals of the integrated circuit of FIG. 1 in order to detect the event. Additionally, event detector 125 may be integral with or separate from circuitry block 102, and may monitor events occurring at one or more circuitry blocks of the integrated circuit of FIG. 1.

Test clock generator 130 is operable to generate a clock signal for testing purposes at the integrated circuit of FIG. 1. For example, test clock generator 130 may generate a periodic clock signal having a frequency adequate to resolve relative timings of monitored internal signals. Test clock generator 130 is typically separate from whatever clocks drive the normal operations of circuitry block 102. Test logic timer 140 may respond when it detects a rising edge of the clock signal, a falling edge of the clock signal, etc.

Test logic timer 140 is operable to increment a counter value based upon the received clock signal in order to correlate the timing of signals acquired across multiple iterations of an event. Upon detection of the event, event detector 125 is operable to apply a reset signal in order to reset the counter value of test logic timer 140. Upon receiving the reset signal, test logic timer 140 may reset the counter value to a predefined value (e.g., 0).

Testing element 150 is operable to receive a selected subset of internal operational signals from test MUX hierarchy 120 and to receive counter values from test logic timer 140. In this manner, each time an event is detected, the selected internal operational signals and counter values may be recorded over time (e.g., by a logic analyzer coupled with testing element 150). Since the number of internal operational signals that can be applied to testing element 150 at the same time is limited, testing element 150 may not include all signals desired for testing. Thus, the same event may be triggered again, and a new subset of signals selected for acquisition by test MUX hierarchy 120. The new subset of signals may then be correlated in time with the old subset of signals based upon the counter values. Thus, more signals can be measured and correlated in time to determine the integrated circuit's response to an event than would normally be physically allowed by the output path. If testing element 150 comprises a logic analyzer or other component, testing element 150 may acquire and/or analyze the retrieved signals itself (e.g., testing element 150 may be a logic analyzer or other component). On the other hand, if testing element 150 comprises a signaling pathway (e.g., a General Purpose Input/Output (GPIO) pathway), testing element 150 may pass along each subset of signals to an external analysis component. The subsets of signals can then be correlated with each other (based on the counter values defining a common time base) to determine the full behavior of the integrated circuit in response to the event.

In some embodiments, no GPIO pins may be available at the integrated circuit. This may be the case, for example, when the test signals desired to be measured are too high-frequency for GPIO pins to measure. As such, testing element 150 may comprise or utilize acquired test data stored in an internal memory of the integrated circuit. The acquired test data may then be read out from the integrated circuit memory via, for example, an existing Joint Test Action Group (JTAG) port. This data may be read out at a slower rate than the data was actually acquired, and then post-processed based on the counter values to determine a response of the integrated circuit over time to a given stimulus. In this manner, high-frequency signals of the integrated circuit may be tested without the expense of integrating a specialized high-speed port into the circuit for testing purposes.

Note that the particular arrangement of components described herein is merely intended to be exemplary, and one of ordinary skill in the art will appreciate that the specific arrangement and configuration of electronic circuits is merely a matter of design choice.

Figure 2:
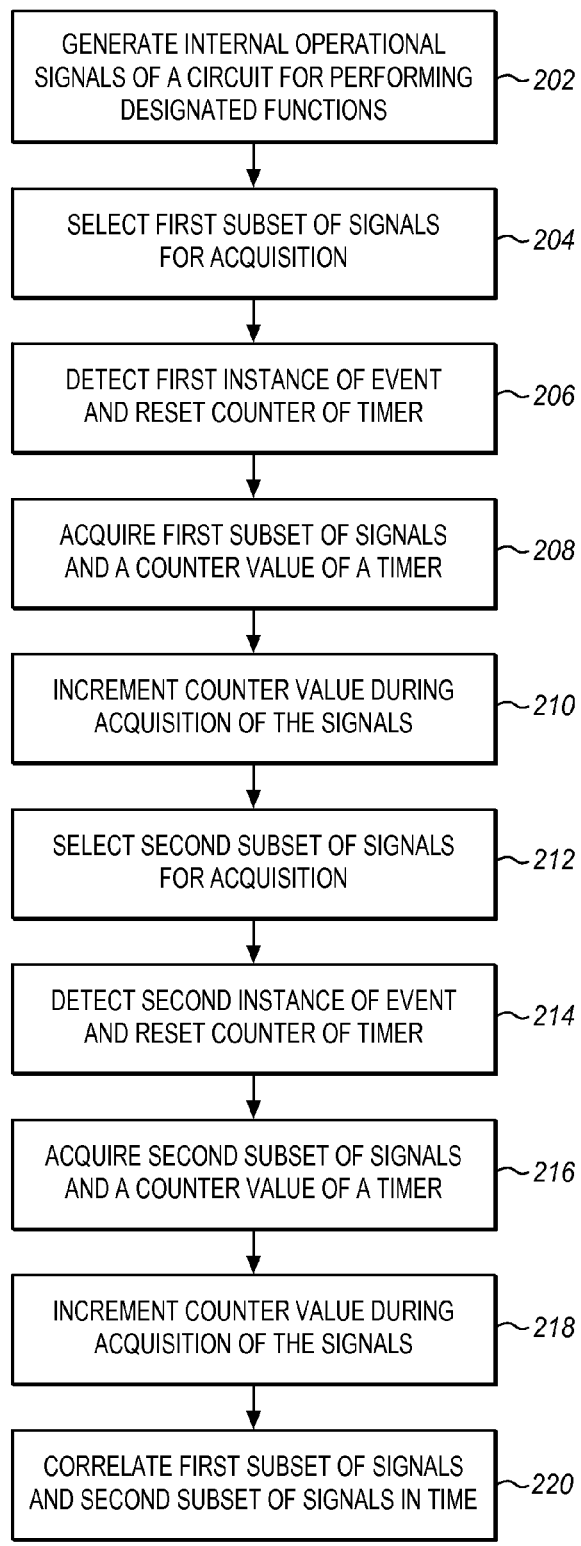
FIG. 2 is a flowchart describing an exemplary method in accordance with features and aspects hereof to coordinate test data acquired across multiple iterations of an event.

FIG. 2 is a flowchart describing an exemplary method 200 in accordance with features and aspects hereof to coordinate test data acquired across multiple iterations of an event. The method of FIG. 2 may be operable in an electronic integrated circuit such as described above with regard to FIG. 1.

Step 202 comprises generating internal operational signals for performing designated functions at a block of circuitry of an integrated circuit. Thus, according to step 202, the integrated circuit may be performing operations as it normally would while performing the functions that it was designed for.

Step 204 comprises selecting, via a test multiplexer (MUX) hierarchy of the integrated circuit, a first subset of the internal operational signals for acquisition by a testing element. Selecting the first subset may comprise programming registers at each MUX or other component of the test MUX hierarchy in order to route the selected internal operational signals to a test output used by the test MUX hierarchy.

Step 206 comprises detecting a first instance of an event at the integrated circuit. The event may comprise any electrically detectable occurrence measurable at the integrated circuit. Upon detection of the event, a signal may be applied to reset a counter value of a test logic timer of the integrated circuit. In this manner, the test logic timer may reliably indicate the passage of time after detecting each instance of the event.

Step 208 comprises receiving, responsive to detecting the event, the first subset of signals and the counter value of the test logic timer. The first subset of signals may be acquired (e.g., by a logic analyzer coupled to the testing element) by detecting the selected signals as received at the testing element of the integrated circuit. The counter value may be included among the selected signals or may be applied independently from the selected signals.

Step 210 comprises incrementing the counter value of the test logic timer while receiving the signals, based upon a clock signal for the test logic timer. Thus, the test signals and related timer values are not merely received by the testing element at a single instance in time, but are rather received across a period of time, which allows the response of the various signals to the detected event to be measured.

Upon successful receipt of the first subset of signals over time, it may be desirable to receive a second subset of signals in order to get a more complete picture of the response of the integrated circuit to the detected event. Thus, using the test MUX hierarchy, a second subset of the internal operational signals may be selected for application in step 212. This may be performed in a manner similar to step 204 described above.

Step 214 comprises detecting a second instance of the event at the integrated circuit and resetting the counter of the test logic timer responsive to detecting the event. Detecting the second instance of the event may occur in a similar fashion to detecting the first instance of the event, described in step 206 above. Thus, the same counter value associated with both the first subset and the second subset of signals may indicate the passage of the same amount of time after the event has occurred.

Step 216 comprises receiving, responsive to detecting the event, the second subset of signals and the counter value of the test logic timer. This may occur in a similar fashion to step 208 described above.

Step 218 comprises during receipt of the signals, incrementing the counter value of the test logic timer based upon the clock signal. This may be performed in a similar fashion to step 210 described above.

Steps 212-218 described above may be repeated for each additional subset of signals that a user wishes to acquire in order facilitate testing and analysis of the integrated circuit.

Step 220 comprises correlating the first subset of signals and the second subset of signals in time. This may be performed by determining common counter values shared between the first and second subset, and identifying signals associated with the common values as having occurred at the same point in time relative to a triggering event. For example, when a counter value for a signal from the first subset matches the counter value for a signal from the second subset, the values of both of those signals can be considered to occur simultaneously. In short, even though the two events were actually measured at different times and responsive to different instances of the event, the counter values indicate that the same amount of time passed since the triggering event for both iterations. Since the triggering event is the same in both cases, the signals may be compiled to form a more complete picture of how the integrated circuit responds to the event (i.e., because the circuit reliably responds the same way each time the event occurs).

Figure 3:
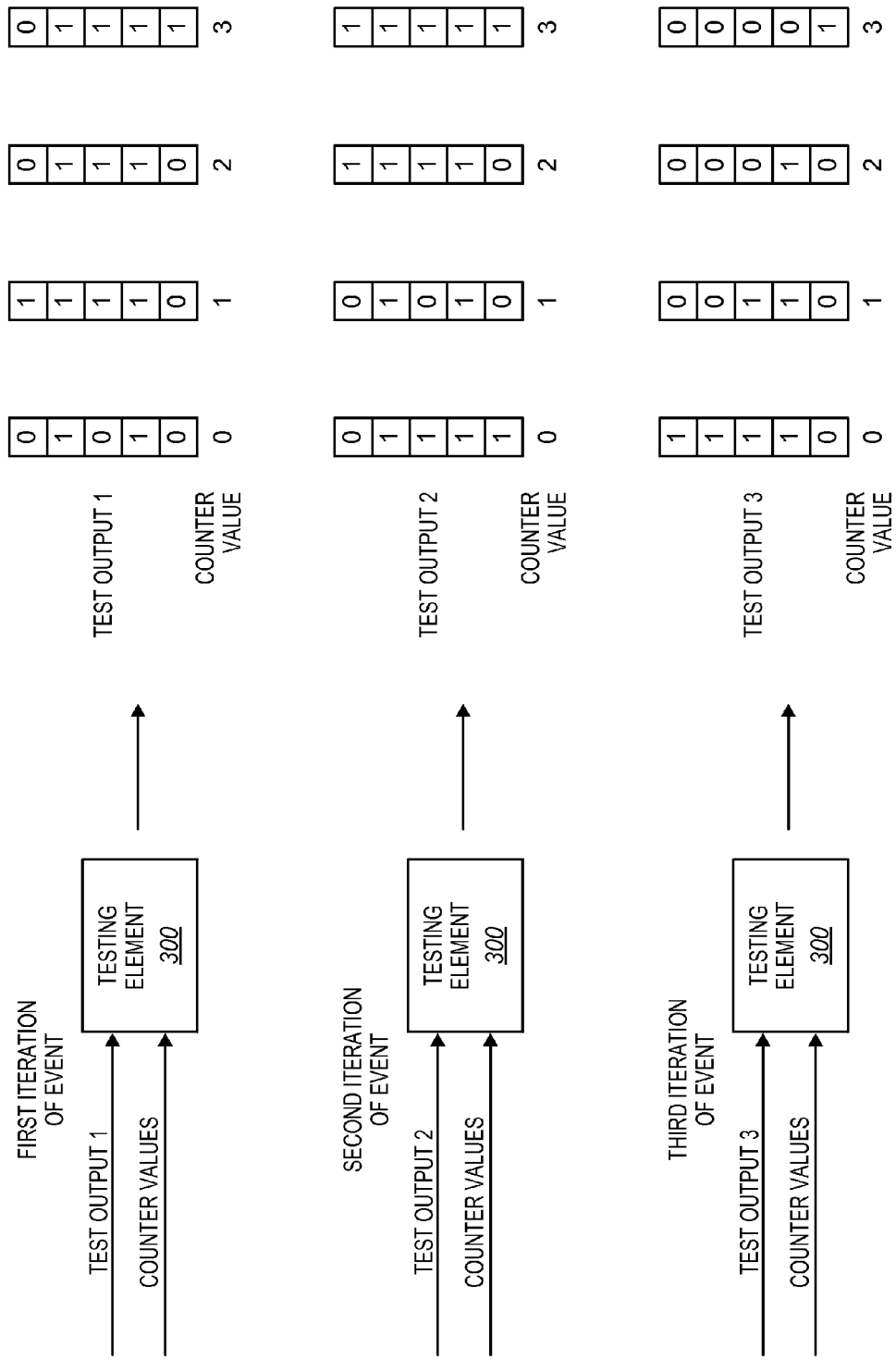
FIG. 3 is a block diagram illustrating an exemplary acquisition of test data responsive to multiple iterations of an event in accordance with features and aspects hereof.

FIG. 3 is a block diagram illustrating an exemplary acquisition of test data responsive to multiple iterations of an event in accordance with features and aspects hereof. According to FIG. 3, a testing element 300 receives three separate test outputs, each test output triggered by a different iteration of the same event. Along with each test output, testing element 300 receives counter values indicating the passage of time from the triggering event. A different set of signals is acquired for each of the iterations of the event, so the values measured by testing element 300 at the same times after the event show different values. Each set of values (test output 1, 2, 3, etc.) is measured over time, and the counter values are uniformly reset to a predetermined value (e.g., 0) upon detection of the same event. Because they are uniform across each iteration of the event, the counter values indicate the change in a given signal (or set of signals) at specific times after the triggering event has been detected.

Figure 4:
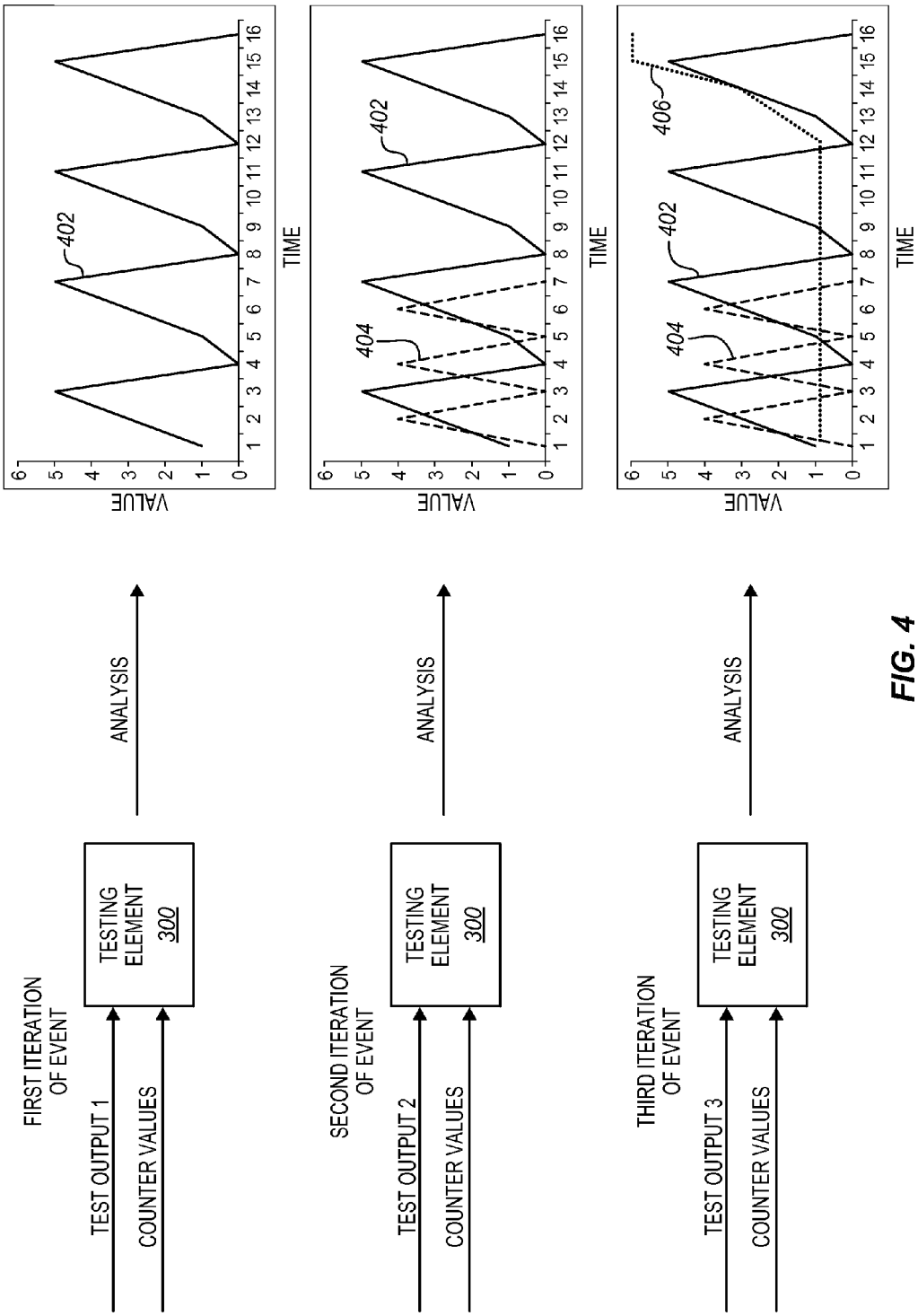
FIG. 4 is a block diagram illustrating an exemplary analysis of acquired test data responsive to multiple iterations of an event in accordance with features and aspects hereof.

FIG. 4 is a block diagram illustrating an exemplary analysis of acquired test data responsive to multiple iterations of an event in accordance with features and aspects hereof FIG. 4 is provided to conceptually illustrate the ideas described with regard to FIG. 3. For FIG. 4, test output 1 has been simplified to correspond to a single internal operational signal 402, test output 2 to signal 404, and test output 3 to signal 406. According to FIG. 4, after collecting signal 402 responsive to a first iteration of the event, signal 402 may be re-created at chart 410 as it appeared after the triggering event. However, no other information is yet known about signals 404 and 406. Upon a second iteration of the event, a test MUX hierarchy for the integrated circuit is reprogrammed, the counter is reset as the event is detected, and testing element 300 acquires signal 404. By comparing counter values for the two signals, they may be plotted onto the same chart 420 for analysis. A similar approach occurs with signal 406. The test MUX hierarchy is reprogrammed to acquire signal 406, a third iteration of the event occurs, and the counter is reset again as the event is detected. Then, by comparing the counter values for the signals, signal 406 may be plotted with the other two signals at chart 430 to show a more complete picture of how the integrated circuit reacts to the event each time it occurs.

FIG. 5 is a block diagram illustrating a further exemplary integrated circuit in accordance with features and aspects hereof. FIG. 5 includes clock generator 502 operable to provide a clock signal to synchronize independent test logic timers of multiple circuitry blocks of an integrated circuit. Specifically, clock generator 502 provides a clock signal to each of test logic timers 512-516 so that they may update counter values. However, the path traveled by the clock signal across the integrated circuit varies depending upon whether the clock signal is traveling to test logic timer 512, 514, or 516. Because the signaling pathway to each test logic timer is different, each path is associated with a different propagation delay for the clock signal. Owing to the different propagation delay for each signaling pathway, the clock signal will arrive asynchronously at the test logic timers. This means that internal operational signals from different circuitry blocks cannot be properly correlated in time by testing element 520. This is undesirable because it inaccurately portrays the internal operational signals of the integrated circuit, making debugging the circuit much harder, if not impossible.

In FIG. 5, the signaling pathway for each of timers 512, 514, and 516 is associated with a propagation delay of $\Delta 1$, $\Delta 2$, and $\Delta 3$ respectively. To compensate for these propagation delays, clock generator 502 utilizes a clock tree comprising delay lines (e.g., inverters or other electronic components) for inserting further delay into each of the signaling pathways. Specifically, delay lines 504-508 are operable to provide further delay to the signaling pathways so that the propagation delay for each signaling pathway is equal, and the clock signal is received synchronously when it reaches timers 512-516, as indicated by dashed line 510.

For example, if $\Delta 1$ is 5 nanoseconds (ns), $\Delta 2$ is 10 ns, and $\Delta 3$ is 15 ns, delay line 504 may impose a 10 ns delay, delay line 506 may impose a 5 ns delay, and delay line 508 may apply no delay. Thus, after generation of the clock pulse, the clock pulse is received synchronously at the test logic timers of the circuitry blocks 15 ns later.

A similar tree structure may be used to ensure that reset signals supplied to the different test logic timers are received synchronously. This may ensure that the reset signals are released at essentially the same time to all parts of the chip.

For each block, the counter value of the test logic timer may be applied, along with the selected internal operational signals from the block, to testing element 520 via test MUX hierarchy 518. When test logic timers 512-516 increment synchronously and are reset synchronously, any further non-uniform delays between signals routed via test MUX hierarchy 518 to testing element 520 are irrelevant, because the operational signals may be correlated after they are acquired based upon the properly synchronized counter values for the timers. Thus, data received asynchronously from multiple circuitry blocks during an event may still be correlated based upon the counter values in a sensible manner.

In a further embodiment, each circuitry block may comprises a detection unit (i.e., an independent event detector) operable to detect events occurring at the block. Each detection unit may signal detection of the events to a shared event detector (which may itself be one of the detection units), and the event detector may then manage the application of reset signals to test logic timers 512-516. For example, the event detector may controllably reset the counter values of each test logic timer each time an event is detected by a detection unit.

In a still further embodiment each detection unit is operable to detect multiple types of events, and the event detector is operable to apply masking logic (e.g., Boolean logic) to determine which events may trigger reset of the counter values of the test logic timers.

In a still further embodiment each block of circuitry may further comprises a logic analyzer operable to process internal operational signals, and to generate new internal operational signals that are selectable by the test MUX hierarchy. Thus, the signals provided for output to testing element 520 may represent pre-processed internal operational signals.

While the invention has been illustrated and described in the drawings and foregoing description, such illustration and description is to be considered as exemplary and not restrictive in character. One embodiment of the invention and minor variants thereof have been shown and described. Protection is desired for all changes and modifications that come within the spirit of the invention. Those skilled in the art will appreciate variations of the above-described embodiments that fall within the scope of the invention. As a result, the invention is not limited to the specific examples and illustrations discussed above, but only by the following claims and their equivalents.

What is claimed is:

1. An integrated circuit comprising:
    a block of circuitry components operable to generate internal operational signals for performing designated functions;
    a test multiplexer (MUX) hierarchy coupled to receive the internal operational signals and controllably operable to select subsets of the internal operational signals for acquisition and to apply the selected subsets to a testing element;
    a clock generator operable to generate a clock signal for the signals selected via the test MUX hierarchy;
    a test logic timer operable to receive the clock signal, to increment a counter value based upon the clock signal, and further operable to apply the counter value to the testing element; and
    an event detector operable to reset the counter value to a predefined value upon detection of an event, such that a first subset of the internal operational signals acquired from the test MUX hierarchy acquired responsive to detection of a first instance of the event are correlated in time with a second subset of the internal operational signals acquired responsive to detection of a second instance of the event.

2. The integrated circuit of claim 1 further comprising:
the testing element, the testing element operable to correlate the first subset of signals with the second subset of signals based on the counter values provided for each of the subsets.

3. The integrated circuit of claim 2 wherein:
the testing element is further operable to correlate the first subset and the second subset by correlating elements of the first subset to elements of the second subset associated with the same counter value.

4. The integrated circuit of claim 1 wherein:
the block comprises the test logic timer, and the block is one of multiple blocks of the circuit, each block comprising a test logic timer operable to receive the clock signal and to increment a counter value based upon the clock signal.

5. The integrated circuit of claim 4 wherein:
the clock generator comprises a clock tree operable to selectively delay the clock signal applied to the test logic timer of each block, the selective delay determined for each test logic timer based upon a propagation delay associated with a signaling pathway traversed by the clock signal to reach the test logic timer, the delays for the clock signal coordinated to synchronously provide the clock signal to the test logic timers of the blocks.

6. The integrated circuit of claim 4 wherein:
the event detector is further operable to reset a counter value of each test logic timer to the predefined value upon detection of the event by applying a reset signal to the test logic timers, and
the event detector comprises a reset tree for providing the reset signal, the reset tree operable to selectively delay the reset signal applied to each test logic timer, the selective reset delay determined for each test logic timer based upon a propagation delay associated with a signaling pathway traversed by the reset signal to reach the test logic timer, the delays for the reset signal coordinated to synchronously provide the reset signals to the test logic timers.

7. The integrated circuit of claim 4 wherein:
each block further comprises a detection unit operable to detect events occurring at the block and to signal detection of the events to the event detector, and
the event detector is further operable to controllably reset the counter values of each test logic timer based upon the events detected by the detection units.

8. The integrated circuit of claim 7 wherein:
the event detector is operable to apply masking logic to determine which events may trigger reset of the counter values of the test logic timers.

9. The integrated circuit of claim 4 wherein:
each block further comprises a logic analyzer operable to process internal operational signals, and to generate new internal operational signals based upon the processing that are selectable by the test MUX hierarchy.

10. The integrated circuit of claim 1 further comprising:
the testing element, the testing element comprising one or more General Purpose Input/Output (GPIO) pins.

11. The integrated circuit of claim 1 wherein:
the clock generator is further operable to generate a clock signal that has a frequency at least equal to the internal operational signal of the block that has the highest frequency.

12. A method comprising:
generating, at a block of circuitry of an integrated circuit, internal operational signals for performing designated functions;
selecting, via a test multiplexer (MUX) hierarchy of the integrated circuit, a first subset of the internal operational signals for acquisition by a testing element;
detecting a first instance of an event at the integrated circuit;
resetting, responsive to detecting the event, a counter value of a test logic timer;
applying, responsive to detecting the event, the first subset of signals and the counter value of the test logic timer to the testing element;
during acquisition, incrementing the counter value of the test logic timer based upon a clock signal for the test logic timer;
selecting, via the test MUX hierarchy, a second subset of the internal operational signals for acquisition by the testing element;
detecting a second instance of the event at the integrated circuit;
resetting, responsive to detecting the event, the counter value of the test logic timer;
applying, responsive to detecting the event, the second subset of signals and the counter value of the test logic timer to the testing element; and
during acquisition, incrementing the counter value of the test logic timer based upon the clock signal,
wherein the first subset of signals and the second subset of signals can be correlated in time based on the counter values acquired with each of the subsets.

13. The method of claim 12 further comprising:
correlating the first subset of signals with the second subset of signals based on the counter values acquired with each of the subsets.

14. The method of claim 13 wherein:
correlating the first subset and the second subset comprises correlating elements of the first subset to elements of the second subset associated with the same counter value.

15. The method of claim 13 wherein:
the block comprises the test logic timer, and the block is one of multiple blocks of the circuit, each block comprising a test logic timer operable to receive the clock signal and to increment a counter value based upon the clock signal.

16. The method of claim 15 further comprising:
distributing the clock signal to the test logic timers via a clock tree, comprising:
for each test logic timer, selectively delaying the clock signal based upon a propagation delay associated with a signaling pathway traversed by the clock signal to reach the test logic timer,
the delays coordinated to synchronously provide the clock signal to the test logic timers of the blocks.

17. The method of claim 15 further comprising:
distributing a reset signal to each test logic timer via a reset tree, comprising:
for each test logic timer, selectively delaying the reset signal based upon a propagation delay associated with a signaling pathway traversed by the reset signal to reach the test logic timer,
the delays coordinated to synchronously provide the reset signal to the test logic timers of the blocks.

18. The method of claim 12 further comprising:
programming masking logic to define which events may trigger reset of the counter value of the test logic timer.

19. The method of claim 12 wherein:
the testing element comprises one or more General Purpose Input/Output (GPIO) pins.

20. The method of claim 12 further comprising:
generating the clock signal at a frequency at least equal to the internal operational signal of the block that has the highest frequency.

* * * * *